(12) United States Patent
Nagao

(10) Patent No.: US 10,249,842 B2
(45) Date of Patent: Apr. 2, 2019

(54) ORGANIC EL DEVICE, ORGANIC EL LIGHTING PANEL, ORGANIC EL LIGHTING APPARATUS, AND ORGANIC EL DISPLAY

(71) Applicant: NEC LIGHTING, LTD., Tokyo (JP)

(72) Inventor: Kazuhiro Nagao, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 0 days.

(21) Appl. No.: 15/738,949

(22) PCT Filed: Jun. 10, 2016

(86) PCT No.: PCT/JP2016/067420
§ 371 (c)(1),
(2) Date: Dec. 21, 2017

(87) PCT Pub. No.: WO2016/208430
PCT Pub. Date: Dec. 29, 2016

(65) Prior Publication Data
US 2018/0183000 A1 Jun. 28, 2018

(30) Foreign Application Priority Data
Jun. 26, 2015 (JP) .................. 2015-129146

(51) Int. Cl.
*H01L 51/52* (2006.01)
*H01L 51/00* (2006.01)
*H01L 51/56* (2006.01)

(52) U.S. Cl.
CPC ...... *H01L 51/5246* (2013.01); *H01L 51/0097* (2013.01); *H01L 51/525* (2013.01);
(Continued)

(58) Field of Classification Search
CPC .......... H01L 51/5246; H01L 51/525
See application file for complete search history.

(56) References Cited

U.S. PATENT DOCUMENTS

2005/0046340 A1* 3/2005 Kohara .......... H01L 51/525
313/504
2006/0192487 A1 8/2006 Choi et al.
(Continued)

FOREIGN PATENT DOCUMENTS

| JP | 2001-118674 | 4/2001 |
| JP | 2011-118674 | 4/2001 |

(Continued)

OTHER PUBLICATIONS

International Search Report dated Aug. 2, 2016, in corresponding PCT International Application.

*Primary Examiner* — Mohammed R Alam
(74) *Attorney, Agent, or Firm* — Finnegan, Henderson, Farabow, Garrett & Dunner, L.L.P.

(57) ABSTRACT

The present invention provides an organic EL device that can prevent an organic EL layer(s) from being damaged when the organic EL device is bent. An organic EL device (10) of the present invention includes: a first substrate (11); a second substrate (12); one or more organic EL elements; and a sealing layer (14). Each of the one or more organic EL elements includes an organic EL layer (13) and a pair of electrodes (16, 17). One surface of the first substrate (11) is a mounting surface on which the one or more organic EL elements are disposed. The first substrate (11) and the second substrate (12) are laminated in such a manner that the mounting surface of the first substrate (11) and one surface of the second substrate (12) face each other with the sealing layer (14) interposed therebetween. The sealing layer (14) seals a gap between the first substrate (11) and the second substrate (12) along an entire periphery of a region facing the second substrate (12) on the mounting surface of the first substrate (11) and an entire periphery of a region facing the first substrate (11) on the surface of the second substrate (12) facing the first substrate (11). The organic EL device further (Continued)

includes one or more supporting layers (15). The supporting layers (15) are disposed in such a manner that the supporting layers (15) connect the whole or part of a region without the one or more organic EL elements on the mounting surface of the first substrate (11) and a region facing the whole or part of the region without the one or more organic EL elements on the surface of the second substrate (12) facing the first substrate (11).

14 Claims, 2 Drawing Sheets

(52) U.S. Cl.
CPC .......... *H01L 51/56* (2013.01); *H01L 51/0023* (2013.01); *H01L 51/5209* (2013.01); *H01L 51/5225* (2013.01); *H01L 2251/5338* (2013.01); *H01L 2251/5361* (2013.01)

(56) References Cited

U.S. PATENT DOCUMENTS

| | | |
|---|---|---|
| 2006/0226773 A1 | 10/2006 | Kim et al. |
| 2007/0126355 A1 | 6/2007 | Chiu et al. |
| 2009/0261719 A1* | 10/2009 | Nimura .............. H01L 51/5246 313/504 |
| 2010/0044733 A1 | 2/2010 | Okabe et al. |
| 2010/0044744 A1 | 2/2010 | Kim et al. |
| 2011/0279026 A1 | 11/2011 | Boerner et al. |
| 2011/0279027 A1 | 11/2011 | Boerner |
| 2011/0285278 A1 | 11/2011 | Boerner |
| 2012/0019129 A1 | 1/2012 | Boerner |
| 2012/0285278 A1 | 11/2012 | Sakai |
| 2015/0076464 A1* | 3/2015 | Sakaguchi ............. H05B 33/04 257/40 |

FOREIGN PATENT DOCUMENTS

| | | |
|---|---|---|
| JP | 2002-151252 | 5/2002 |
| JP | 2004-227792 | 8/2004 |
| JP | 2004-281085 | 10/2004 |
| JP | 2006-172795 | 6/2006 |
| JP | 2006-236794 | 9/2006 |
| JP | 2006-236963 | 9/2006 |
| JP | 2006-252988 | 9/2006 |
| JP | 2006-269515 | 10/2006 |
| JP | 2006-294612 | 10/2006 |
| JP | 2007-335327 | 12/2007 |
| JP | 2011-053339 | 3/2011 |
| JP | 2012-517086 | 7/2012 |
| WO | WO 2008/139746 | 11/2008 |
| WO | WO 2013/146583 | 10/2013 |

* cited by examiner

ORGANIC EL DEVICE, ORGANIC EL LIGHTING PANEL, ORGANIC EL LIGHTING APPARATUS, AND ORGANIC EL DISPLAY

CROSS-REFERENCE TO RELATED PATENT APPLICATIONS

This application is a National Stage Entry of International Application No. PCT/JP2016/067420, filed Jun. 10, 2016, which claims priority from Japanese Patent Application No. 2015-129146, filed Jun. 26, 2015. The entire contents of the above-referenced applications are expressly incorporated herein by reference.

TECHNICAL FIELD

The present invention relates to an organic EL device, an organic EL lighting panel, an organic EL lighting apparatus, and an organic EL display.

BACKGROUND ART

An organic electro-luminescence (EL) device generally is configured as follows. The EL device includes one or more organic EL elements (each including an organic EL layer and a pair of electrodes), a substrate on which the organic EL element(s) is laminated, a sealing substrate, a sealing layer, and a filler. The sealing layer is disposed along outer edges of facing surfaces of the substrate and the sealing substrate, and the substrate and the sealing substrate are laminated with the sealing layer interposed therebetween. A gap between the substrate and the sealing substrate is filled with the filler.

In recent years, among various types of organic EL devices, a flexible organic EL device that can be bent is attracting attention. In the flexible organic EL device, substrates that are flexible (flexible substrates) are used as the substrate and the sealing substrates (Patent Document 1). However, when the flexible organic EL device is bent, the distance between the substrate and the sealing substrate in the thickness direction becomes shorter in the curved portion and the vicinity thereof. This may cause the inner surface of the sealing substrate to be in contact with the organic EL layer(s), resulting in damage to the organic EL layer(s). The damage to the organic EL layer(s) leads to a problem in that light emission is not obtained at the damaged portion.

Further, stress caused by the bending concentrates on the interface between the substrate and the sealing layer and the interface between the sealing substrate and the sealing layer, which may cause the sealing layer to peel off from the substrate or the sealing substrate.

CITATION LIST

Patent Document(s)

Patent Document 1: JP 2001-118674 A

BRIEF SUMMARY OF THE INVENTION

Problem to be Solved by the Invention

With the foregoing in mind, it is an object of the present invention to provide an organic EL device that can prevent an organic EL layer(s) from being damaged when the organic EL device is bent.

Means for Solving Problem

In order to achieve the above object, the present invention provides an organic EL device including: a first substrate; a second substrate; one or more organic EL elements; and a sealing layer. Each of the one or more organic EL elements includes an organic EL layer and a pair of electrodes. One surface of the first substrate is a mounting surface on which the one or more organic EL elements are disposed. The first substrate and the second substrate are laminated in such a manner that the mounting surface of the first substrate and one surface of the second substrate face each other with the sealing layer interposed therebetween. The sealing layer seals a gap between the first substrate and the second substrate along an entire periphery of a region facing the second substrate on the mounting surface of the first substrate and an entire periphery of a region facing the first substrate on the surface of the second substrate facing the first substrate. The organic EL device further includes one or more supporting layers. The supporting layers are disposed in such a manner that the supporting layers connect the whole or part of a region without the one or more organic EL elements on the mounting surface of the first substrate and a region facing the whole or part of the region without the one or more organic EL elements on the surface of the second substrate facing the first substrate.

Effects of the Invention

According to the present invention, it is possible to provide an organic EL device that can prevent an organic EL layer(s) from being damaged when the organic EL device is bent.

MODE FOR CARRYING OUT THE INVENTION

Figure 1A:
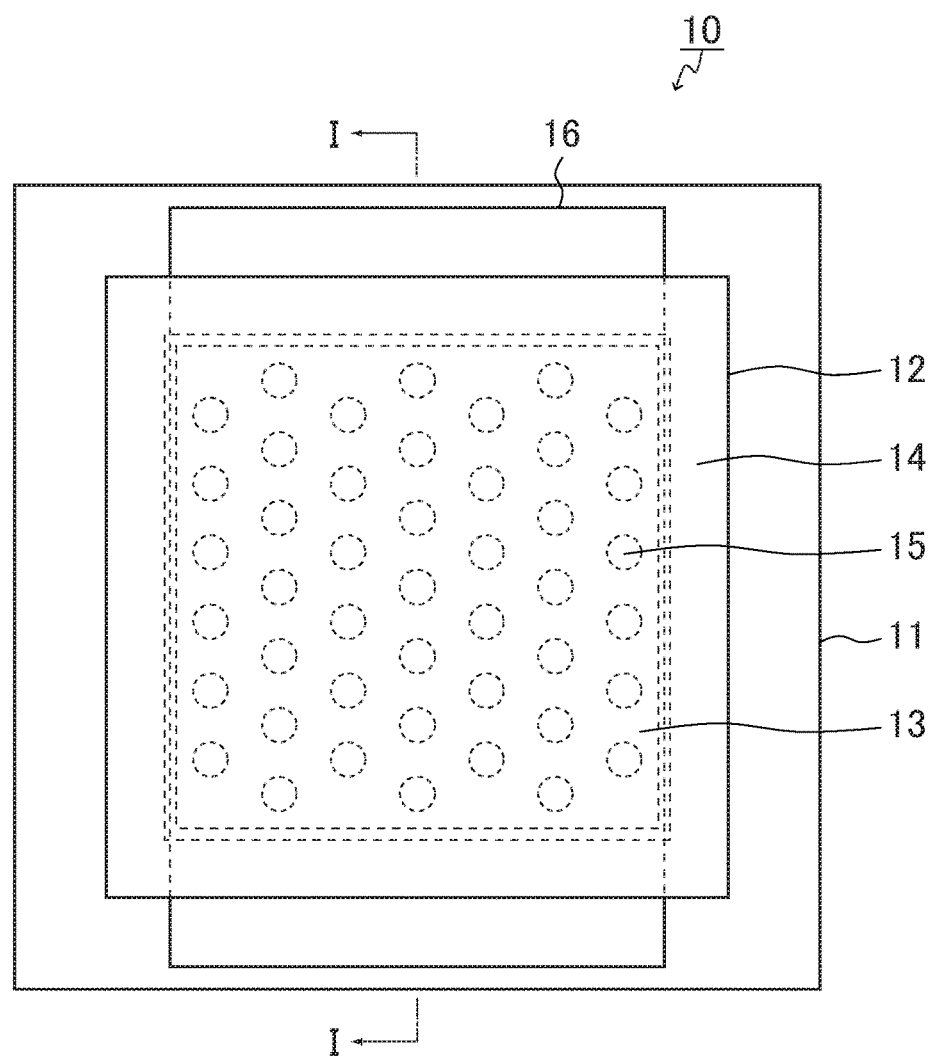
FIG. 1A is a plan view showing an example of the configuration of an organic EL device of a first embodiment.
Figure 1B:
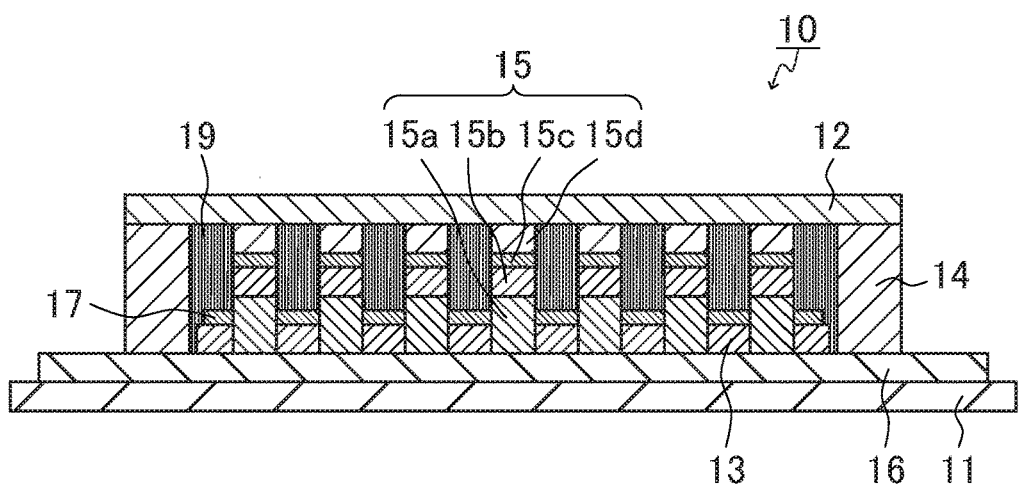
FIG. 1B is a sectional view of the organic EL device shown in FIG. 1A, taken in the arrow direction of line I-I in FIG. 1A.
Figure 2:
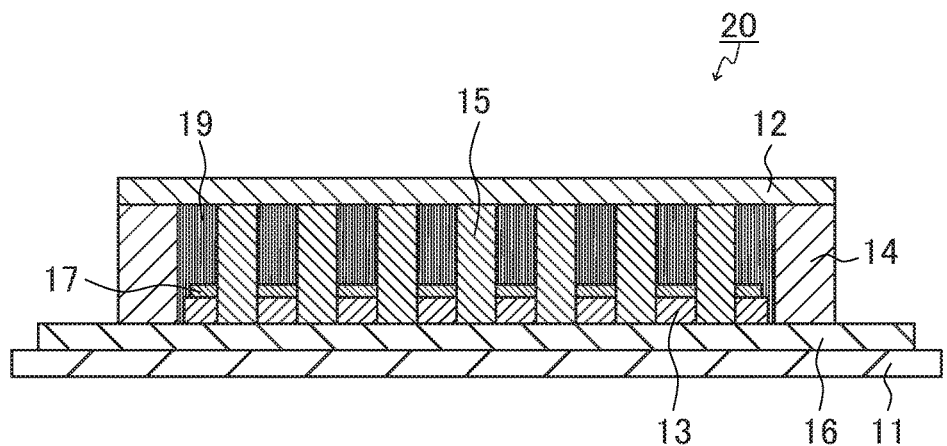
FIG. 2 is a sectional view showing an example of the configuration of an organic EL device of a second embodiment.
Figure 3:
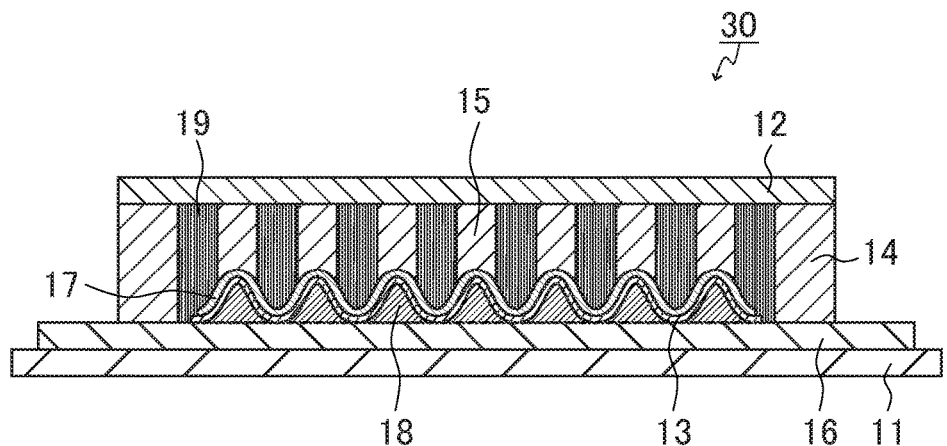
FIG. 3 is a sectional view showing an example of the configuration of an organic EL device of a third embodiment.

The organic EL panel, the organic EL lighting panel, the organic EL lighting apparatus, and the organic EL display according to the present invention will be described specifically below with reference to the accompanying drawings. It is to be noted, however, that the present invention is by no means limited by the following description. In FIGS. 1 to 3 to be described below, the same components are given the same reference numerals, and duplicate explanations thereof may be omitted. Also, in the drawings, the structure of each component may be shown in an simplified form as appropriate for the sake of convenience in illustration, and also, each component may be shown schematically with a dimension ratio and the like that are different from the actual dimension ratio and the like.

First Embodiment

The present embodiment is directed to an example of an organic EL device configured so that: each of supporting layers 15 is a laminate of two or more layers; the supporting layers 15 connect a first substrate 11 and a second substrate 12 via an anode 16 on the first substrate 11; and part of a region without an organic EL element on a mounting surface of the first substrate 11 is a region where the supporting layers 15 are disposed. In this example, the supporting layers 15 are not disposed a region between the periphery of an organic EL layer 13 and a sealing layer 14, which is other part of the region without the organic EL element. It is to be noted, however, that the present embodiment merely shows an example of the configuration of the organic EL device of the present invention, and the organic EL device of the present invention may be configured so that supporting layers are further provided in the region between the periphery of the organic EL layer and the sealing layer. FIGS. 1A and 1B shows the organic EL device of the present embodiment. FIG. 1A is a plan view showing an example of the configuration of the organic EL device of the present embodiment, and FIG. 1B is a sectional view of the organic EL device shown in FIG. 1A, taken in the arrow direction of line 14 in FIG. 1A. As shown in FIGS. 1A and 1B, the organic EL device 10 of the present embodiment includes the first substrate 11, the second substrate 12, the organic EL element, and the sealing layer 14. The organic EL element includes the organic EL layer 13 and a pair of electrodes (an anode 16 and a cathode 17). One surface of the first substrate 11 (the upper surface in FIG. 1B) is a mounting surface on which the organic EL element is disposed. The first substrate 11 and the second substrate 12 are laminated in such a manner that the mounting surface of the first substrate 11 faces one surface of the second substrate 12 (the lower surface in FIG. 1B) with the sealing layer 14 interposed therebetween. The sealing layer 14 seals a gap between the first substrate 11 and the second substrate 12 along an entire periphery of a region facing the second substrate 12 on the mounting surface of the first substrate 11 and an entire periphery of a region facing the first substrate 11 on the surface of the second substrate 12 facing the first substrate 11. The organic EL device 10 of the present embodiment further includes one or more supporting layers 15 (in FIGS. 1A and 1B, the number of the supporting layers 15 is 45). As shown in FIG. 1B, each of the supporting layers 15 is a laminate including a lower supporting layer 15a, a first intermediate supporting layer 15b, a second intermediate supporting layer 15c, and an upper supporting layer 15d. One surface of the lower supporting layer 15a (the lower surface in FIG. 1B) is in contact with the anode 16, and the other surface of the lower supporting layer 15a (the upper surface in FIG. 1B) is in contact with one surface of the first intermediate supporting layer 15b (the lower surface in FIG. 1B). The other surface of the first intermediate supporting layer 15b (the upper surface in FIG. 1B) is in contact with one surface of the second intermediate supporting layer 15c (the lower surface in FIG. 1B). The other surface of the second intermediate supporting layer 15c (the upper surface in FIG. 1B) is in contact with one surface of the upper supporting layer 15d (the lower surface in FIG. 1B), and the other surface of the upper supporting layer 15d (the upper surface in FIG. 1B) is in contact with the surface of the second substrate 12 facing the first substrate 11. With this configuration, the supporting layers 15 connect part of the region without the EL element on the mounting surface of the first substrate 11 and a region facing the part of the region without the organic EL element on the surface of the second substrate 12 facing the first substrate 11. While the organic EL device 10 shown in FIGS. 1A and 1B is in a square shape, the shape of the organic EL device of the present invention is not limited thereto. Examples of the shape of the organic EL device of the present invention include: polygonal shapes other than the square shape, such as parallelogram shapes (including a rectangular shape and a rhombic shape) other than the square shape, a trapezoidal shape, a pentagonal shape, and a hexagonal shape; a circular shape; an oval shape; and shapes similar to these shapes (e.g., a substantially square shape or the like).

The organic EL device 10 of the present embodiment preferably is bendable, i.e., preferably is the so-called flexible organic EL device. To this end, it is preferable that the first substrate 11 and the second substrate 12 are flexible substrates.

It is preferable that the first substrate 11 transmits light emitted from the organic EL layer 13 at a high transmittance. The first substrate 11 preferably has a total light transmittance of at least 80%, more preferably at least 84%. Examples of the material of the first substrate 11 include: polyesters such as polyethylene naphthalate and polyethylene terephthalate; acrylic resins such as polymethyl methacrylate, polyethyl methacrylate, polymethyl acrylate, and polyethyl acrylate; polyether sulfone; and polycarbonates. When moisture permeation cannot be inhibited sufficiently by the first substrate 11 alone, it is preferable to form a barrier film for inhibiting the moisture permeation on the mounting surface of the first substrate 11. The size (the length and the width) of the first substrate 11 is not particularly limited, and can be set as appropriate depending on a desired size of the organic EL device 10, for example. The thickness of the first substrate 11 is not particularly limited, and is in the range from 20 to 300 μm, for example. In addition to or instead of the first substrate 11, the second substrate 12 to be described below may be configured so as to transmit light emitted from the organic EL layer 13 at a high transmittance.

Examples of the material of the second substrate 12 include those described above as examples of the material of the first substrate 11. Although it is not always necessary that the first substrate 11 and the second substrate 12 are formed of the same material, it is preferable that the first substrate 11 and the second substrate 12 are subjected to the same or substantially the same bending stress. The thickness of the second substrate 12 is not particularly limited, and is in the range from 20 to 300 μm, for example.

The organic EL element is a laminate in which the anode 16, the organic EL layer 13, and the cathode 17 are laminated in this order. In the organic EL device 10 of the present embodiment, the anode 16 is formed on the first substrate 11. The lower supporting layers 15a are formed on the anode 16. The organic EL layer 13 and the first intermediate supporting layers 15b are formed on the anode 16 and on the lower supporting layers 15a, respectively, using the same material. The cathode 17 and the second intermediate supporting layers 15c are formed on the organic EL layer 13 and on the first intermediate supporting layers 15b, respectively, using the same material. As a result, a region where the anode 16, the organic EL layer 13, and the cathode 17 are laminated serves as the organic EL element, and regions where the lower supporting layers 15a are interposed between the anode 16 and the first intermediate supporting layers 15b, i.e., regions where the supporting layers 15 are to be disposed, form part of the region without the organic EL element.

It is preferable that the anode 16 transmits light emitted from the organic EL layer 13 at a high transmittance. The anode 16 preferably has a total light transmittance of at least 85%. Examples of the material of the anode 16 include indium tin oxide and indium zinc oxide. While the anode 16 in the organic EL device 10 shown in FIGS. 1A and 1B is in a rectangular shape, the organic EL device of the present embodiment is not limited thereto. The anode 16 may have any shape as long as voltage application to the organic EL layer 13 is possible. When there are a plurality of organic EL elements, a plurality of anodes 16 may be formed separately for the respective organic EL elements. However, it is preferable to form the anode 16 as a continuous film as shown in FIGS. 1A and 1B, for example. This can eliminate the necessity of patterning the anode 16 or can simplify the patterning of the anode 16, so that the organic EL device 10 can be produced more easily at lower cost, for example. Also, it is possible to avoid trouble such as the occurrence of a short circuit in the organic EL element owing to roughness in the patterned peripheries of the anode 16, for example. The thickness of the anode 16 is not particularly limited, and is in the range from 50 to 300 nm, for example. When the second substrate 12 is formed of a material with a high transmittance, the positions of the anode 16 and the cathode 17 to be described below are interchangeable.

As the organic EL layer 13, a conventionally known and commonly used organic EL layer may be used. The organic EL layer 13 has, for example, a multilayer structure including, in sequence, a hole injection layer, a hole transport layer, a light emission layer containing an organic EL material, an electron transport layer, and an electron injection layer. The thickness of each layer included in the organic EL layer 13 is not particularly limited, and is in the range from 1 to 200 nm, for example. The thickness of the organic EL layer 13 as a whole is not particularly limited, and is in the range from 100 to 1000 nm, for example.

The material of the cathode 17 is aluminum or silver, for example. Also, the cathode 17 may be formed of a material with a high transmittance, examples of which include those described above as examples of the material of the anode 16. For example, when the first substrate 11, the second substrate 12, the anode 16, and the cathode 17 are all formed of materials with a high transmittance, it is possible to produce the organic EL device 10 that is transparent as a whole. The thickness of the cathode 17 is not particularly limited, and is in the range from 50 to 300 nm, for example.

Examples of the material of the sealing layer 14 include ultraviolet-curable adhesives and thermosetting adhesives, such as epoxy resins and acrylic resins. The sealing layer 14 is formed so that the thickness thereof is slightly greater than the total thickness of the organic EL layer 13 and the cathode 17. The thickness of the sealing layer 14 is in the range from 1 to 100 µm, for example.

Each of the supporting layers 15 in the organic EL device 10 shown in FIGS. 1A and 1B is in a columnar shape. It is to be noted, however, that the organic EL device 10 of the present embodiment is not limited thereto, and each of the supporting layers 15 may be in a polygonal columnar shape such as a hexagonal columnar shape, for example. Although the supporting layer 15 in a grid pattern may be formed such that the organic EL element is divided into segments by the supporting layer 15 and the segments are surrounded by the supporting layer 15, it is preferable to dispose the columnar supporting layers 15 so as to form a dot pattern in a plan view, as shown in FIG. 1A, for example. With this configuration, for example, the contact area between the first substrate 11 and the second substrate 12 can be made smaller as compared with the case where the supporting layer 15 in a grid pattern is formed, which allows the organic EL device 10 to have higher flexibility and also to have a larger light emission region as described below. The cross-sectional area per supporting layer 15 in the in-plane direction of the mounting surface of the first substrate 11 preferably corresponds to the area of a circle with an average diameter of not less than 5 µm and not more than 300 µm, more preferably a circle with an average diameter of not less than 8 µm and not more than 100 µm. The above-described cross-sectional area per supporting layer 15 preferably is in the range from 15 to 80000 µm$^2$, more preferably from 50 to 8000 µm$^2$.

In the in-plane direction of the mounting surface of the first substrate 11, the density of the supporting layers 15 in a region surrounded by the sealing layer 14 preferably is in the range from 10 to 10000 supporting layers/cm$^2$. By setting the density in the above-described range, it is possible to more suitably prevent the surface of the second substrate 12 facing the first substrate 11 from coming into contact with the organic EL layer 13 when the organic EL device 10 is bent. As a result, the damage to the organic EL layer 13 can be prevented more suitably. It is more preferable that the density is in the range from 100 to 400 supporting layers/cm$^2$. On the mounting surface of the first substrate 11, a light emission region in the region surrounded by the sealing layer 14 preferably is at least 80%, more preferably at least 90%. The light emission region is a region provided with the organic EL element.

The lower supporting layers 15a preferably are insulating layers. The material of the lower supporting layers 15a may be a resin or an inorganic compound, and examples of the material of the lower supporting layers 15a include those described above as examples of the materials of the first substrate 11 and the second substrate 12. The thickness of the lower supporting layers 15a is not particularly limited. The lower supporting layers 15a preferably has an average thickness in the range from not less than 0.2 µm and not more than 100 µm, more preferably an average thickness in the range from not less than 1 µm and not more than 30 µm.

Each of the first intermediate supporting layers 15b has the same configuration as the organic EL layer 13, as described above.

The material and the thickness of the second intermediate supporting layers 15c are the same as those described above for the cathode 17.

It is preferable that the upper supporting layers 15d are formed of the same material as the sealing layer 14. The thickness of the upper supporting layers 15d is not particularly limited. For example, as shown in FIG. 1B, the thickness of the upper supporting layers 15d may be a value obtained by subtracting, from the thickness of the sealing layer 14, the thicknesses of the lower supporting layers 15a, the first intermediate supporting layers 15b, and the second intermediate supporting layers 15c. Alternatively, the upper supporting layers 15d may have the same thickness as the sealing layer 14, or may have any other thickness.

In the organic EL device 10 of the present embodiment, gaps that are present between the first substrate 11 and the second substrate 12 and surrounded by the sealing layer 14 may be filled with a filler 19. The filler 19 may be an inert gas, for example. By using, as the filler 19, a mixture obtained by mixing a desiccant such as calcium oxide with silicone, it is possible to more suitably prevent the surface of the second substrate 12 facing the first substrate 11 from coming into contact with the organic EL layer 13 when the organic EL device 10 is bent. As a result, the damage to the organic EL layer 13 can be prevented more suitably.

Next, a method for producing the organic EL device 10 of the present embodiment will be described with reference to an illustrative example. It is to be noted, however, that this production method is merely illustrative, and the organic EL device 10 of the present embodiment may be produced by any method.

First, the anode 16 is formed on the mounting surface of the first substrate 11. The anode 16 can be formed by, for example, forming a film of the above-described material of the anode 16 according to a conventionally known method such as sputtering or chemical vapor deposition (CVD) with the use of a shadow mask. The anode 16 also can be formed by uniformly applying the above-described material of the anode 16 on the mounting surface of the first substrate 11 to form a film and patterning the thus-formed film into a desired shape by photolithography.

Next, the lower supporting layers 15a are formed on the anode 16. The lower supporting layers 15a can be formed in the same manner as the anode 16 using the above-described material of the lower supporting layers 15a, for example. The lower supporting layers 15a also can be formed by applying the above-described material of the lower supporting layers 15a by dispensed coating, ink-jet coating, or printing such as screen printing, flexographic printing, or gravure printing.

When the lower supporting layers 15a are formed by photolithography, the lower supporting layers 15a can be formed by, for example, forming a photoresist film on the anode 16 and patterning the thus-formed photoresist film by photolithography. The photoresist may be either a negative photoresist or a positive photoresist. For example, the photoresist may be a negative photoresist such as an acrylic resin, novolac, or polyimide. The photolithography is preferable because it is possible to form a fine pattern of a 10-μm scale, and further, light emitted from the organic EL layer 13 is not blocked if a transparent acrylic resin is used as the photoresist.

When the lower supporting layers 15a are formed by printing, the printing process may be repeated a plurality of times until the lower supporting layers 15a have a desired thickness. When the lower supporting layers 15a are formed by printing, the cross-sectional area per lower supporting layer 15a in the in-plane direction of the mounting surface of the first substrate 11 is larger as compared with the case where the lower supporting layers 15a are formed by photolithography. However, printing brings about the following advantages: the thickness can be increased easily; a wider range of material selection is allowed; and printing requires simple forming steps and a simple apparatus, so that the lower supporting layers 15a can be formed with high efficiency at low cost.

Next, the organic EL layer 13 and the first intermediate supporting layers 15b are formed at the same time on the anode 16 and on the lower supporting layers 15a, respectively, using the same material. By forming the organic EL layer 13 and the first intermediate supporting layers 15b at the same time using the same material as described above, it is possible to eliminate the necessity of patterning these components or simplify the patterning of these components, so that the organic EL device 10 can be produced more easily, for example. The same applies to the cathode 17 and the second intermediate supporting layers 15c to be described below. The organic EL layer 13 and the first intermediate supporting layers 15b can be formed using a conventionally known material by a conventionally known method, such as vacuum deposition by resistance heating, molecular beam epitaxy (MBE), or laser ablation, with the use of a shadow mask, for example. When the organic EL layer 13 and the first intermediate supporting layers 15b are formed using a polymeric material, the organic EL layer 13 and the first intermediate supporting layers 15b can be formed on the anode 16 and the lower supporting layer 15a, respectively, by applying the polymeric material in the liquid form by printing such as inkjet printing. It is also possible to apply the polymeric material in the form of a photosensitive coating solution by spin coating or slit coating and to form the organic EL layer 13 and the first intermediate supporting layers 15b on the anode 16 and on the lower supporting layer 15a, respectively, by photolithography.

Next, the cathode 17 and the second intermediate supporting layers 15c are formed at the same time on the organic EL layer 13 and on the first intermediate supporting layer 15b, respectively, using the same material. The cathode 17 and the second intermediate supporting layers 15c can be formed using the above-described material of the cathode 17 by a conventionally known method such as vacuum deposition or sputtering, for example.

Next, the sealing layer 14 and the upper supporting layers 15d are formed at the same time on the anode 16 and on the second intermediate supporting layer 15d, respectively, using the same material as described above. Thereafter, the second substrate 12 is bonded to the upper surfaces of the sealing layer 14 and the upper supporting layers 15d with an adhesive or by fusion. Through the above-described process, the organic EL device 10 of the present embodiment can be obtained.

With the configuration of the organic EL device 10 of the present embodiment in which the supporting layers 15 are disposed so as to connect part of a region without the EL element on the mounting surface of the first substrate 11 and a region facing the part of the region without the organic EL element on the surface of the second substrate 12 facing the first substrate 11, it is possible to prevent the distance between the first substrate 11 and the second substrate 12 in the thickness direction from becoming shorter when the organic EL device 10 is bent, whereby the organic EL layer 13 can be prevented from being damaged when the organic EL device 10 is bent. Further, by disposing the columnar supporting layers 15 so as to form a dot pattern in a plan view as shown in FIG. 1A, the bending stress applied when the organic EL device 10 is bent is distributed, so that it is possible to prevent the sealing layer 14, the lower supporting layers 15a, and the upper supporting layers 15d from peeling off from the first substrate 11 or the second substrate 12.

The organic EL device 10 of the present embodiment can be used in a wide range of applications, such as, for example, an organic EL lighting panel, an organic EL lighting apparatus, and an organic EL display, as described below.

Second Embodiment

The present embodiment is directed to an example of an organic EL device configured so that: each of supporting layers 15 has a single layer structure; the supporting layers 15 connect a first substrate 11 and a second substrate 12 via an anode 16 on the first substrate 11; and part of a region without an organic EL element on a mounting surface of the first substrate 11 is a region not provided with an organic EL layer 13. FIG. 2 is a sectional view showing an example of the configuration of the organic EL device of the present embodiment. As shown in FIG. 2, the organic EL device 20 of the present embodiment has the same configuration as the organic EL device 10 of the first embodiment, except that each of the supporting layers 15 has a single layer structure.

Examples of the material of the supporting layers 15 include those described above as examples of the materials of the lower supporting layers 15a and the sealing layer 14 in the first embodiment. The thickness of the supporting layers 15 is not particularly limited. For example, the supporting layers 15 may have the same thickness as a sealing layer 14 as in the example shown in FIG. 2, or may have any other thickness.

Next, a method for producing the organic EL device 20 of the present embodiment will be described with reference to an illustrative example. It is to be noted, however, that this production method is merely illustrative, and the organic EL device 20 of the present embodiment may be produced by any method.

First, the anode 16 is formed on the mounting surface of the first substrate 11 in the same manner as in the first embodiment. When there are a plurality of organic EL elements, a plurality of anodes 16 may be formed separately for the respective organic EL elements. However, it is preferable to form the anode 16 as a continuous film as shown in FIG. 2, for example. This can eliminate the necessity of patterning the anode 16 or can simplify the patterning of the anode 16, so that the organic EL device 20 can be produced more easily at lower cost, for example. Also, it is possible to avoid trouble such as the occurrence of a short circuit in the organic EL element owing to roughness in the patterned peripheries of the anode 16, for example. The same applies to the third embodiment.

Next, the supporting layers 15 are formed on the anode 16 using the above-described material of the supporting layers 15 in the same manner as the lower supporting layers 15*a* in the first embodiment. The supporting layers 15 are formed in such a manner that the supporting layers 15 have the same thickness as the sealing layer 14 to be formed subsequently.

Next, in the same manner as in the first embodiment, the organic EL layer 13 is formed on a region on the anode 16 excluding portions where the supporting layers 15 have been formed.

Next, the cathode 17 is formed only on the organic EL layer 13 in the same manner as in the first embodiment.

Next, the sealing layer 14 is formed on the anode 16, and the second substrate 12 is bonded to the upper surfaces of the sealing layer 14 and the supporting layers 15 with an adhesive or by fusion. Through the above-described process, the organic EL device 20 of the present embodiment can be obtained.

The organic EL device 20 of the present embodiment also can exhibit the same effect as the organic EL device 10 of the first embodiment. The organic EL device 20 of the present embodiment also can be used in the same applications as the organic EL device 10 of the first embodiment.

Third Embodiment

The present embodiment is directed to an example of an organic EL device configured so that: part of a region without an organic EL element on a mounting surface of a first substrate 11 is provided with a pair of electrodes (an anode 16 and a cathode 17) and an organic EL layer 13, and insulating layers 18 are provided between the pair of electrodes (the anode 16 and the cathode 17). FIG. 3 is a sectional view showing an example of the configuration of the organic EL device of the present embodiment. As shown in FIG. 3, the organic EL device 30 of the present embodiment has the same configuration as the organic EL device 10 of the first embodiment, except that: the insulating layers 18 are formed at the positions of the lower supporting layers 15*a*; the organic EL layer 13 is formed as a continuous film; the cathode 17 is formed as a continuous film on the organic EL layer 13; and supporting layers 15 are formed at the positions of the upper supporting layers 15. In the organic EL device 30 of the present embodiment, a region where the anode 16, the organic EL layer 13, and the cathode 17 are laminated serves as the organic EL element, and regions where the anode 16, the insulating layers 18, the organic EL layer 13, and the cathode 17 are laminated form part of a region without the organic EL element.

The insulating layers 18 are patterned so that each insulating layer 18 has an inverted V-shape with smooth slopes. The cross-sectional area of the base part of the inverted V-shape per insulating layer 18 in the in-plane direction of the mounting surface of the first substrate 11 preferably corresponds to the area of a circle with an average diameter of not less than 5 μm and not more than 300 μm, more preferably a circle with an average diameter of not less than 8 μm and not more than 100 μm. The above-described cross-sectional area of the base part of the inverted V-shaped insulating layer 18 preferably is in the range from 15 to 80000 μm$^2$, more preferably from 50 to 8000 μm$^2$. The thickness (height) of the insulating layers 18 is not particularly limited. The insulating layers 18 preferably have an average thickness in the range from not less than 0.2 μm and not more than 100 μm, more preferably in the range from not less than 1 μm and not more than 30 μm. Examples of the material of the insulating layers 18 include those described above as examples of the material of the lower supporting layers 15*a* in the first embodiment and photoresist materials that allow fine patterning of a 10-μm scale (e.g., acrylic resins, novolac, and polyimide).

Examples of the material of the supporting layers 15 include those described above as examples of the material of the upper supporting layers 15*d* in the first embodiment. The thickness of the supporting layers 15 is not particularly limited. For example, as shown in FIG. 3, the thickness of the supporting layers 15 may be a value obtained by subtracting, from the thickness of the sealing layer 14, the thicknesses of the insulating layers 18, the organic EL layer 13, and the cathode 17. Alternatively, the supporting layers 15 may have the same thickness as the sealing layer 14, or may have any other thickness.

Next, a method for producing the organic EL device 30 of the present embodiment will be described with reference to an illustrative example. It is to be noted, however, that this production method is merely illustrative, and the organic EL device 30 of the present embodiment may be produced by any method.

First, the anode 16 is formed on the mounting surface of the first substrate 11 in the same manner as in the first embodiment.

Next, the insulating layers 18 are formed on the anode 16 using the above-described material of the insulating layers 18 in the same manner as the lower supporting layers 15*a* in the first embodiment. At this time, the insulating layers 18 can be formed into the inverted V-shapes with smooth slopes easily by adjusting the temperature at which the insulating layers 18 are formed so that the above-described material of the insulating layers 18 has a desired viscosity.

Next, the organic EL layer 13 is formed on the anode 16 and the insulating layers 18 in the same manner as in the first embodiment, except that the organic EL layer 13 is formed as a continuous film.

Next, the cathode 17 is formed as a continuous film on the organic EL layer 13 in the same manner as in the first embodiment.

Next, the sealing layer 14 and the supporting layers 15 are formed at the same time on the anode 16 and on the cathode 17, respectively, using the same material. Thereafter, the second substrate 12 is bonded to the upper surfaces of the sealing layer 14 and the supporting layers 15 with an adhesive or by fusion. Through the above-described process, the organic EL device 30 of the present embodiment can be obtained. For example, by disposing the columnar supporting layers 15 so as to form a dot pattern in a plan view as in the first embodiment, the contact area between the first substrate 11 and the second substrate 12 can be made smaller as compared with the case where the supporting layer 15 in a grid pattern is formed, which allows the organic EL device 30 to have higher flexibility and also to have a larger light emission region, for example.

The organic EL device 30 of the present embodiment also can exhibit the same effect as the organic EL device 10 of the first embodiment. The organic EL device 30 of the present embodiment also can be used in the same applications as the organic EL device 10 of the first embodiment. Further, in the organic EL device 30 of the present embodiment, the organic EL layer 13 is a continuous film. This can eliminate the necessity of patterning the organic EL layer 13 or can simplify the patterning of the organic EL layer 13, so that the organic EL device 30 can be produced easily.

Fourth Embodiment

In the present embodiment, the organic EL lighting panel according to the present invention will be described. The organic EL panel of the present invention is characterized in that it includes the organic EL device of any of the first to third embodiments. Other configurations or conditions are by no means limited, and may be the same as those in conventionally known organic EL lighting panels, for example.

Fifth Embodiment

In the present embodiment, the organic EL lighting apparatus according to the present invention will be described. The organic EL lighting apparatus of the present invention is characterized in that it includes the organic EL device of any of the first to third embodiments or the organic EL lighting panel of the fourth embodiment. Other configurations or conditions are by no means limited, and may be the same as those in conventionally known organic EL lighting apparatuses, for example.

Sixth Embodiment

In the present embodiment, the organic EL display according to the present invention will be described. The organic EL display of the present invention is characterized in that it includes the organic EL device of any of the first to third embodiments or the organic EL lighting panel of the fourth embodiment. Other configurations or conditions are by no means limited, and may be the same as those in conventionally known organic EL displays, for example.

While the present invention has been described above with reference to exemplary embodiments, the present invention is by no means limited thereto. Various changes and modifications that may become apparent to those skilled in the art may be made in the configuration and specifics of the present invention without departing from the scope of the present invention.

This application claims priority from Japanese Patent Application No. 2015-129146 filed on Jun. 26, 2015. The entire disclosure of this Japanese patent application is incorporated herein by reference.

INDUSTRIAL APPLICABILITY

According to the present invention, it is possible to provide an organic EL device that can prevent an organic EL layer(s) from being damaged when the organic EL device is bent. The organic EL device of the present invention can be used in a wide range of applications, such as an organic EL lighting panel, an organic EL lighting apparatus, and an organic EL display, for example.

EXPLANATION OF REFERENCE NUMERALS

10, 20, 30: organic EL device
11: first substrate
12: second substrate
13: organic EL layer
14: sealing layer
15: supporting layer
16: anode
17: cathode
18: insulating layer

The invention claimed is:

1. An organic EL (electro-luminescence) device comprising: a first substrate; a second substrate; one or more organic EL elements; and a sealing layer, each of the one or more organic EL elements comprising an organic EL layer and a pair of electrodes, one surface of the first substrate being a mounting surface on which the one or more organic EL elements are disposed, the first substrate and the second substrate being laminated in such a manner that the mounting surface of the first substrate and one surface of the second substrate face each other with the sealing layer interposed therebetween, the sealing layer sealing a gap between the first substrate and the second substrate along an entire periphery of a region facing the second substrate on the mounting surface of the first substrate and an entire periphery of a region facing the first substrate on the one surface of the second substrate facing the first substrate, wherein the organic EL device further comprises supporting layers, the supporting layers comprise a layer of material of the sealing layer, a layer of material of one of the pair of electrodes, a layer of material of the organic EL layer, and an insulating layer that is interposed between the pair of electrodes, and the supporting layers are disposed in such a manner that the supporting layers connect the mounting surface of the first substrate and the one surface of the second substrate facing the first substrate via the other one of the pair of electrodes.

2. The organic EL device according to claim 1, wherein a cross-sectional area per supporting layer in an in-plane direction of the mounting surface of the first substrate is in a range from 15 to 80000 $\mu m^2$.

3. The organic EL device according to claim 1, wherein in an in-plane direction of the mounting surface of the first substrate, the density of the supporting layers in a region surrounded by the sealing layer is in a range from 10 to 10000 supporting layers/$cm^2$.

4. The organic EL device according to claim 1, wherein in an in-plane direction of the mounting surface of the first substrate, a light emission region in a region surrounded by the sealing layer is at least 80%.

5. The organic EL device according to claim 1, wherein the one or more organic EL elements are a laminate in which an electrode layer as one of the pair of electrodes, the organic EL layer, and another electrode layer as the other one of the pair of electrodes are laminated in this order in a direction in which the first substrate and the second substrate face each other.

6. The organic EL device according to claim 5, wherein in the one or more organic EL elements, the electrode layer on a first substrate side is an anode and the another electrode layer on a second substrate side is a cathode.

7. The organic EL device according to claim 1, wherein the first substrate and the second substrate are flexible substrates.

8. The organic EL device according to claim 1, wherein the gap between the first substrate and the second substrate in a region surrounded by the sealing layer is filled with a filler.

9. An organic EL lighting panel comprising:
the organic EL device according to claim 1.

10. An organic EL lighting apparatus comprising:
the organic EL device according to claim 1.

11. An organic EL display comprising:
the organic EL device according to claim 1.

12. An organic EL lighting apparatus comprising:
the organic EL lighting panel according to claim 9.

13. An organic EL display comprising:
the organic EL lighting panel according to claim 9.

14. The organic EL device according to claim 1, wherein the supporting layers are a laminate including a lower supporting layer, a first intermediate supporting layer, a second intermediate supporting layer, and an upper supporting layer in this order from a first substrate side, the lower supporting layer is the insulating layer, the first intermediate supporting layer is the layer of material of the organic EL layer, the second intermediate supporting layer is the layer of material of one of the pair of electrodes formed on a side opposite to the first substrate, and the upper supporting layer is the layer of material of the sealing layer.

* * * * *